United States Patent
Shih et al.

(10) Patent No.: US 8,536,653 B2
(45) Date of Patent: Sep. 17, 2013

(54) METAL OXIDE SEMICONDUCTOR TRANSISTOR

(75) Inventors: Hung-Lin Shih, Hsinchu (TW); Tsan-Chi Chu, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 14 days.

(21) Appl. No.: 12/904,166

(22) Filed: Oct. 14, 2010

(65) Prior Publication Data

US 2011/0031555 A1 Feb. 10, 2011

Related U.S. Application Data

(63) Continuation of application No. 11/538,815, filed on Oct. 5, 2006.

(51) Int. Cl.
*H01L 21/70* (2006.01)

(52) U.S. Cl.
USPC .................. 257/369; 257/E27.062

(58) Field of Classification Search
USPC ............. 257/369, 204, 929, 371, 351, 190, 257/192, 19, 24, 156, 550, 61, E21.619, E21.11, 257/E21.43, E21.431, E27.108, E29.021, 257/E29.121, E27.062, 344, 346, 347; 438/300, 438/301, 305–307, 375, 142, 548
See application file for complete search history.

(56) References Cited

U.S. PATENT DOCUMENTS

| 5,268,324 | A | * | 12/1993 | Aitken et al. | ................. 438/217 |
| 5,913,116 | A | | 6/1999 | Gardner | |
| 5,970,351 | A | | 10/1999 | Takeuchi | |
| 6,004,851 | A | * | 12/1999 | Peng | ............................. 438/301 |
| 6,159,815 | A | | 12/2000 | Lustig | |
| 6,211,023 | B1 | * | 4/2001 | Yeh et al. | ...................... 438/299 |
| 6,274,894 | B1 | | 8/2001 | Wieczorek | |
| 6,297,114 | B1 | * | 10/2001 | Iwata et al. | ................... 438/305 |
| 6,300,201 | B1 | * | 10/2001 | Shao et al. | ..................... 438/281 |
| 6,362,034 | B1 | * | 3/2002 | Sandford et al. | ............. 438/197 |
| 6,632,718 | B1 | | 10/2003 | Grider | |
| 6,699,763 | B2 | | 3/2004 | Grider | |
| 6,762,102 | B2 | * | 7/2004 | Kasuya | ......................... 438/287 |
| 7,078,285 | B1 | * | 7/2006 | Suenaga | ...................... 438/199 |

(Continued)

FOREIGN PATENT DOCUMENTS

| TW | 304285 | 5/1997 |
| TW | 445632 | 7/2001 |

(Continued)

*Primary Examiner* — Matthew Landau
*Assistant Examiner* — Latanya N Crawford
(74) *Attorney, Agent, or Firm* — Winston Hsu; Scott Margo

(57) ABSTRACT

A metal oxide semiconductor transistor includes a substrate including a first well, a second well, and an insulation between the first well and the second well, a first gate structure disposed on the first well, a second gate structure disposed on the second well, four first dopant regions disposed in the substrate at two sides of the first gate structure, and in the substrate at two sides of the second gate structure respectively, two second dopant regions disposed in the substrate at two sides of the first gate structure respectively, two first epitaxial layers disposed in the substrate at two sides of the first gate structure respectively and two first source/drain regions disposed in the substrate at two sides of the first gate structure respectively, wherein each of the first source/drain regions overlaps with one of the first epitaxial layers and one of the second dopant regions simultaneously.

8 Claims, 15 Drawing Sheets

(56) References Cited

U.S. PATENT DOCUMENTS

| | | |
|---|---|---|
| 7,176,110 B2 | 2/2007 | van Bentum |
| 7,176,522 B2 | 2/2007 | Cheng |
| 7,348,232 B2 * | 3/2008 | Chidambaram et al. ...... 438/199 |
| 7,378,305 B2 | 5/2008 | Hatada |
| 7,390,707 B2 * | 6/2008 | Kawamura et al. .......... 438/197 |
| 7,402,496 B2 | 7/2008 | Liu |
| 7,407,860 B2 * | 8/2008 | Kim et al. .................... 438/300 |
| 7,449,753 B2 * | 11/2008 | Wang et al. .................. 257/369 |
| 7,491,615 B2 | 2/2009 | Wu |
| 7,579,262 B2 | 8/2009 | Hoentschel |
| 7,952,147 B2 * | 5/2011 | Ueno et al. ................... 257/369 |
| 2005/0035409 A1 | 2/2005 | Ko |
| 2005/0035470 A1 | 2/2005 | Ko |
| 2005/0040465 A1 * | 2/2005 | Park et al. ................... 257/347 |
| 2005/0093084 A1 | 5/2005 | Wang |
| 2006/0024876 A1 * | 2/2006 | Chidambaram et al. ...... 438/198 |
| 2006/0046367 A1 | 3/2006 | Rotondaro |
| 2006/0086987 A1 * | 4/2006 | Chen et al. ................... 257/369 |
| 2006/0148220 A1 * | 7/2006 | Lindert et al. ................ 438/514 |
| 2006/0151776 A1 * | 7/2006 | Hatada et al. .................. 257/19 |
| 2006/0157797 A1 | 7/2006 | Tateshita |
| 2006/0199285 A1 | 9/2006 | Chidambaram |
| 2006/0286736 A1 | 12/2006 | Orlowski |
| 2007/0020839 A1 | 1/2007 | Sridhar |
| 2007/0020866 A1 * | 1/2007 | Cheng ........................... 438/301 |
| 2007/0102759 A1 * | 5/2007 | Chen et al. .................... 257/335 |
| 2007/0200179 A1 | 8/2007 | Chen |
| 2007/0235802 A1 | 10/2007 | Chong |
| 2007/0298574 A1 | 12/2007 | Ekbote |
| 2008/0023771 A1 * | 1/2008 | Romero et al. ............... 257/369 |
| 2008/0029815 A1 | 2/2008 | Chen |
| 2008/0061366 A1 * | 3/2008 | Liu et al. ...................... 257/336 |
| 2008/0085577 A1 | 4/2008 | Shih |

FOREIGN PATENT DOCUMENTS

| | | |
|---|---|---|
| TW | 448512 | 8/2001 |
| TW | 481895 | 4/2002 |
| TW | 200400569 | 1/2004 |

* cited by examiner

US 8,536,653 B2

METAL OXIDE SEMICONDUCTOR TRANSISTOR

CROSS REFERENCE TO RELATED APPLICATIONS

This patent application is a continuation application of and claims priority to U.S. patent application Ser. No. 11/538,815, filed on Oct. 5, 2006, and entitled "METHOD OF MANUFACTURING COMPLEMENTARY METAL OXIDE SEMICONDUCTOR TRANSISTOR", the entire contents of which are incorporated herein by reference.

BACKGROUND OF THE INVENTION

1. Field of the Invention

The present invention relates to a structure of a metal oxide semiconductor transistor (MOS).

2. Description of the Prior Art

As semiconductor components become smaller, transistor manufacturing has been improved significantly in order to manufacture transistors of small volume and high quality. When a salicide (self-aligned silicide) process is performed on a small transistor, the silicon substrates of the source/drain are depleted excessively. This results in the crystal lattices of the source/drain being damaged, and the PN junction between the source/drain and the substrate being too close to the silicide, causing leakage, and the component to lose efficacy.

Therefore, current transistor manufacturing processes utilize a selective epitaxial growth (SEG) process to build a high source/drain of the transistor, so that the silicide is formed without depletion of the silicon substrate, and the efficacy of the component is thereby increased.

Please refer to FIGS. 1 to 5. FIGS. 1 to 5 are schematic diagrams of manufacturing a CMOS transistor according to the prior art. As FIG. 1 shows, a substrate 102 includes an N well 104, a P well 106, and a shallow trench isolation (STI) 108. A plurality of gate structures 110 and 112 are deposited on the substrate 102. The gate structure 110 is formed on the N well 104, the gate structure 112 is formed on the P well 106, and the STI 108 is formed between the adjacent gate structures 110 and 112 in the substrate 102. The substrate 102 is a P type silicon substrate, and the gate structures 110, 112 are made from conductive material such as poly-silicon.

Next, a first light ion implanting process is performed by a mask (not shown), and P type light dopant drains 114 are formed in the N well 104 of the two lateral sides of the gate 110. Afterwards, a second light ion implanting process is performed by another mask (not shown), and N type light dopant drains 116 are formed in the P well 106 of the two lateral sides of the gate 112. The sequence of forming the P type light dopant drain and the N type light dopant drain can be alternated. Subsequently, a dielectric layer (not shown) is deposited on the substrate 102 to cover the gate structures 110 and 112. Next, an anisotropic etch process is performed on the dielectric layer, so as to form a spacer 122 around the gate structures 110, 112.

Please refer to FIG. 2. A patterned photo-resist layer 202 covers the P well 106 and the gate structure 110. Subsequently, the gate structure 110, the spacer 122 around the gate structure 110, and the patterned photo-resist layer 202 form a mask on which a P$^-$ ion implanting process is performed, so as to form a P$^-$ dopant region 204 outside the spacer 122 and in the N well 104. Next, the patterned photo-resist layer 202 is removed.

Please refer to FIG. 3. A cap layer (not shown) is deposited on the substrate 102. And then, a patterned photo-resist layer 304 is selectively formed on the cap layer and the P well 106. The gate structure 110, the spacer 122 around the gate structure 110, and the patterned photo-resist layer 304 form a mask on which is performed a P$^+$ ion implanting process, so as to form a P$^+$ dopant region 306 outside the spacer 122 and the N well 104. Then, an etching process is performed, and the cap layer becomes the patterned photo-resist layer 304. Next, the patterned photo-resist layer 304 is then removed.

Please refer to FIG. 4. The patterned cap layer 302, the gate structure 110, and the spacer around the gate structure 110 form the mask. An etching process is performed by appropriate etching selectivity and a recess 400 is formed outside between the spacer 122 and the STI 108 and in the N well 104. Next, a SEG process is performed, and an epitaxial silicon layer 402 is formed in each recess 400. The material of the epitaxial silicon layer 402 could be silicon, SiGe, or SiC. Subsequently, the patterned cap layer 302 is removed.

Please refer to FIG. 5. Another patterned photo-resist layer (not shown) is formed on the N well 104. The gate structure 112 and the spacer 122 around the gate structure 112 form the mask. An N$^+$ ion implanting process is performed to form a source/drain 502 outside the spacer 122 around the gate structure 112 and in the P well 106. The source/drain 502 are the N$^+$ dopant regions. Next, the patterned photo-resist layer is removed.

Afterwards, another patterned photo-resist layer (not shown) is formed on the P well 106. The gate structure 110 and the spacer 122 around the gate structure 110 form the mask. A P$^+$ ion implanting process is performed to form the source/drain 504 outside the spacer 122 around the gate structure 110 in the N well 104. The source/drain 504 are P$^+$ dopant regions. Next, the patterned photo-resist layer is removed. Then, an annealing process is performed to activate the dopant in the substrate, and repair the crystal lattice in the surface of the substrate 102, which is damaged by the ion implanting processes. Of course, the sequence of forming the source/drain can be alternated.

At this point, the above-mentioned manufacture is completed. The N channel MOS (NMOS) transistor 506 of the CMOS transistor is formed by the gate structure 112, and the source/drain 502. The P channel MOS (PMOS) transistor 508 of the CMOS transistor is formed by the gate structure 110, and the source/drain 504.

The prior art requires the patterned cap layer 302 to be the hard mask of the recess 400 etching process and the SEG process of the PMOS transistor 508. Forming the patterned cap layer 302 is a necessary process in the prior art. The cap layer, however, which is 300 to 400 angstroms, is deposited on the substrate 102. An etching process is performed on the cap layer to form the patterned cap layer 302. Without the patterned cap layer 302, the etching process on the cap layer cannot be performed completely, and a partial cap layer will remain on the N well 104. The un-etched cap layer on the substrate 102 means the recess 400 etching process cannot form the ideal recess 400, and the transistor cannot have optimum performance. The recess etching process 400 influences the pitch of the poly-line of the gate structure, so the influence on the transistor is huge.

SUMMARY OF THE INVENTION

The present invention relates to a structure of a MOS to solve the problem of the prior art.

One embodiment of the present invention provides a metal oxide semiconductor transistor. The metal oxide semiconductor transistor includes a substrate comprising at least a first well, at least a second well, and an insulation between the first well and the second well. The metal oxide semiconductor transistor also includes a first gate structure disposed on the first well, a second gate structure disposed the second well, four first dopant regions disposed in the substrate at two sides of the first gate structure, and in the substrate at two sides of the second gate structure respectively, two second dopant regions disposed in the substrate at two sides of the first gate structure respectively, two first epitaxial layers disposed in the substrate at two sides of the first gate structure respectively and two first source/drain regions disposed in the substrate at two sides of the first gate structure respectively. Each of the first source/drain regions overlaps with one of the first epitaxial layers and one of the second dopant regions simultaneously.

The method of fabricating the MOS of the present invention provides a novel structure of MOS, in which each of the first source/drain regions overlaps with one of the first epitaxial layers and one of the second dopant regions simultaneously.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a method of forming a MOS transistor such as a PMOS transistor, an NMOS transistor, or a CMOS transistor. It applies to strained-silicon MOS transistors or a selective epitaxial growth (SEG) process that builds a high source/drain of the transistor.

The following description will depict a method of making a CMOS as example. The PMOS or NMOS can be fabricated in the similar method.

Figure 1:
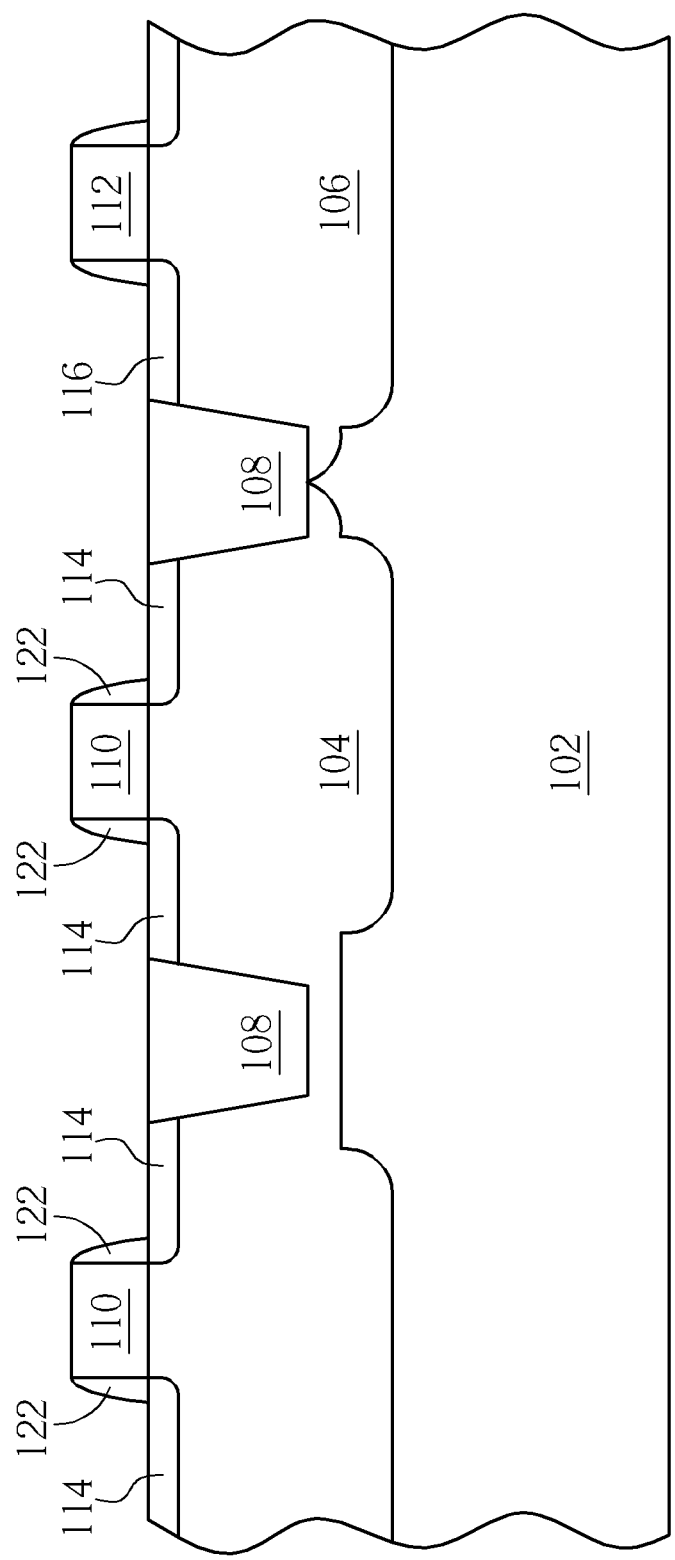
FIGS. 1 to 5 are schematic diagrams of manufacturing a CMOS transistor according to the prior art.
Figure 2:
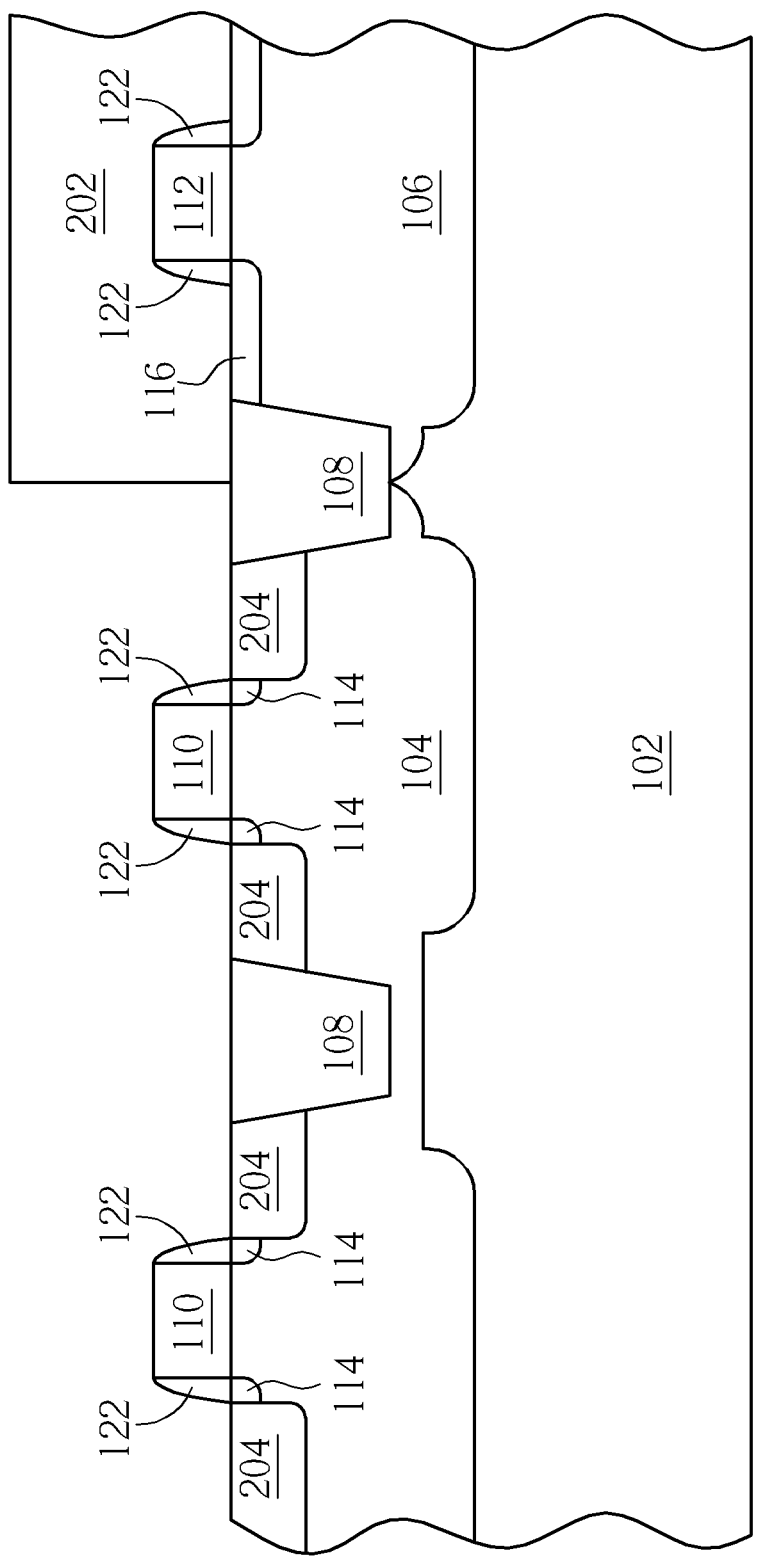
Figure 3:
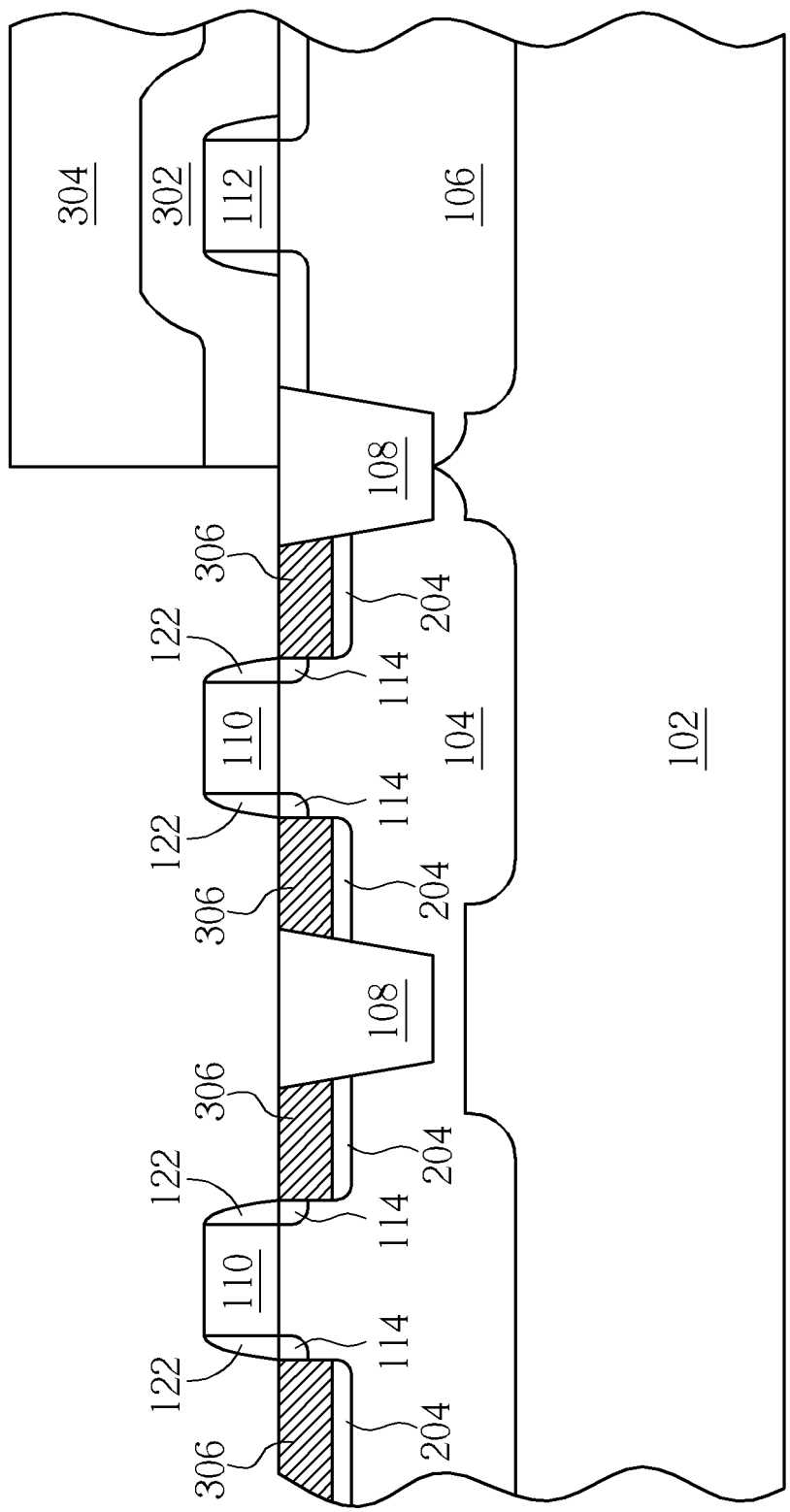
Figure 4:
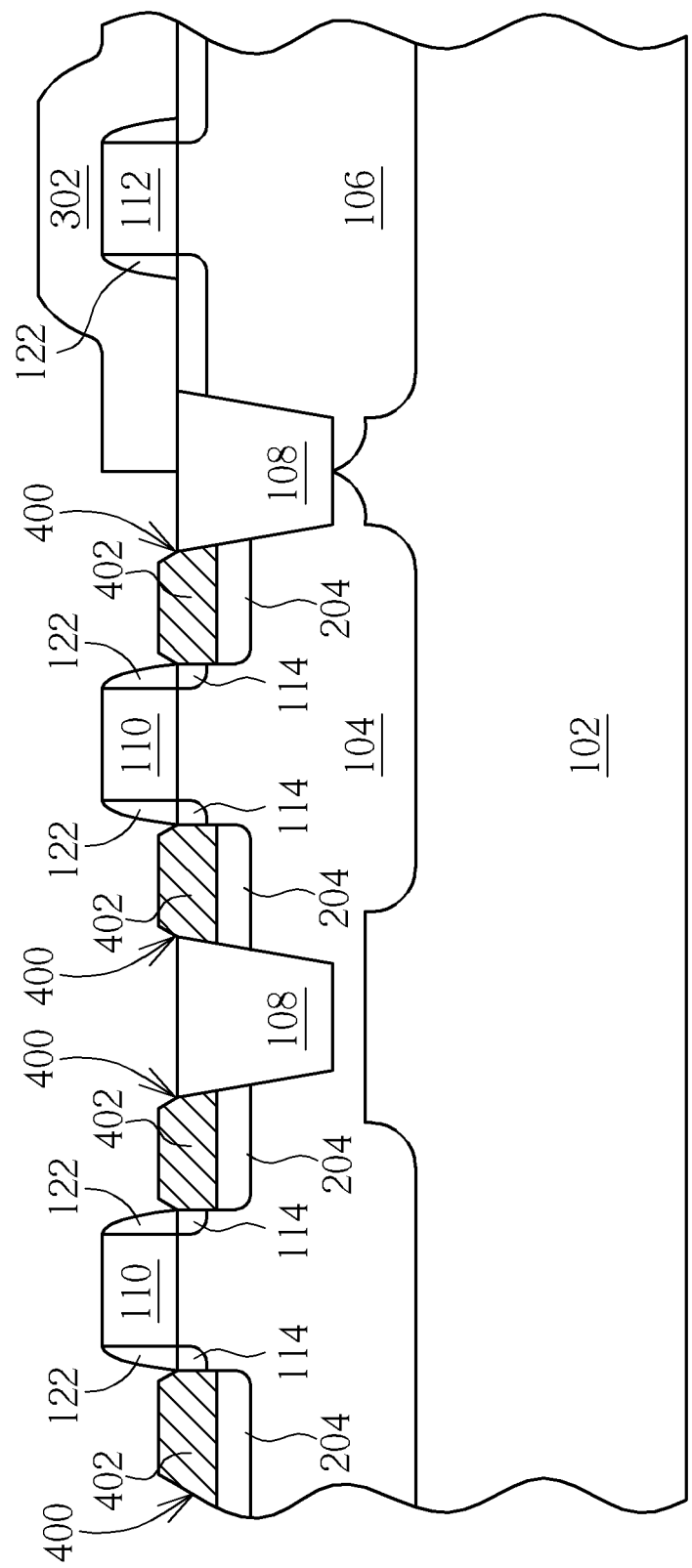
Figure 5:
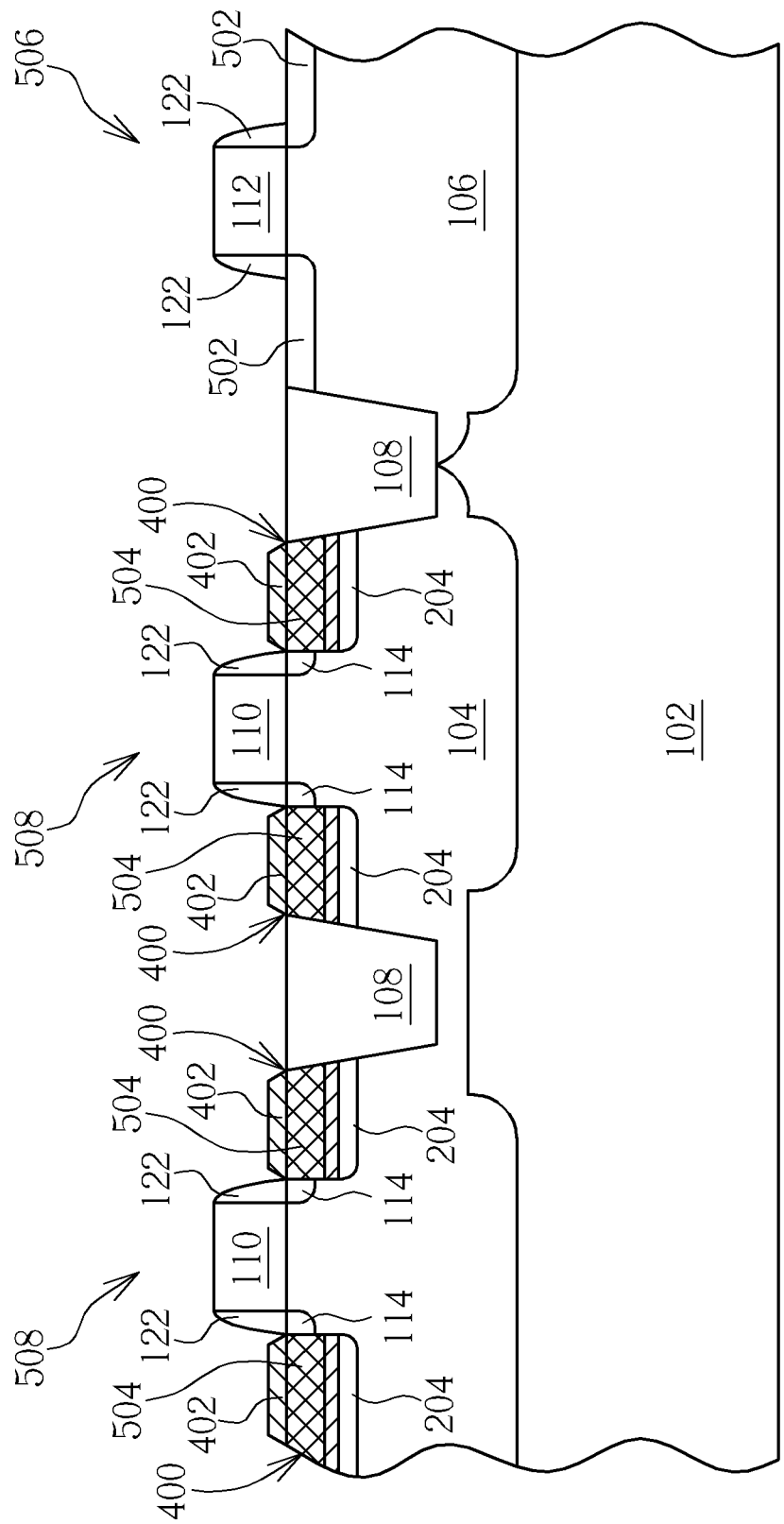
Figure 6:
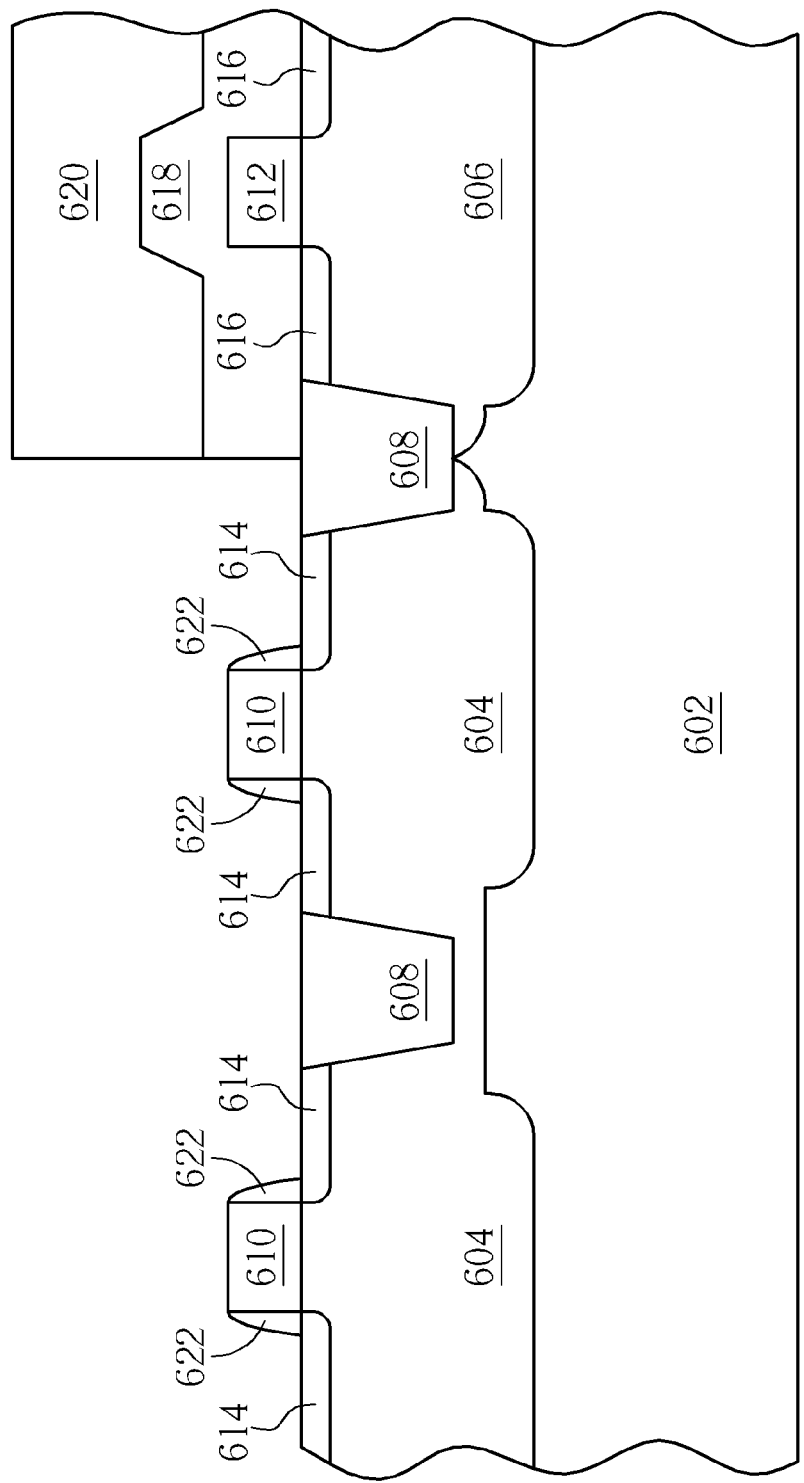
FIGS. 6 to 11 are schematic diagrams of manufacturing a CMOS transistor according to the first embodiment of the present invention.

Please refer to FIGS. 6 to 11. FIGS. 6 to 11 are schematic diagrams of manufacturing a CMOS transistor according to the first embodiment of the present invention. As FIG. 6 shows, a substrate 602 could be a P type silicon substrate, an N type silicon substrate, or a silicon on insulation (SOI) in the first embodiment. The substrate 602 includes an N well 604, a P well 606, and a shallow trench isolation (STI) 608. A plurality of gate structures 610 and 612 are deposited on the substrate 602. The gate structure 610 is formed on the N well 104, the gate structure 612 is formed on the P well 606, and the STI 608 is formed between the adjacent gate structures 610 and 612 in the substrate 602. The gate structures 610, 612 are stacks made by the conductive material such as a polysilicon and a gate dielectric layer. A light ion implanting process is performed by a mask (not shown) to form P type light dopant regions 614 in the two lateral sides of the gate structure 610 and in the N well 604. Another light ion implanting process is then performed by another mask (not shown) to form N type light dopant regions 616 in the two lateral sides of the gate structure 612 and in the P well 606. The sequence of forming the P type light dopant region 614 and the N type light dopant region 616 could be alternated. In this embodiment, the N-PKT could selectively be implanted outside the P type light dopant region 614, and the P-PKT could selectively be implanted outside the N type light dopant region 614 to avoid leakage.

Next, a dielectric layer (not shown) is deposited on the substrate 602 and covers the gate structures 610, 612 completely. A patterned photo-resist layer 620 is formed on the dielectric layer. The patterned photo-resist layer 620 only covers the P well 606, and does not cover the N well 604. An anisotropic etching process is performed on the dielectric layer, and the patterned photo-resist layer 620 is the etching mask for forming the spacer 622 around the gate structure 610 on the N well 604. The dielectric layer on the P type well 606 will not be etched, because it is covered by the patterned photo-resist layer 620. A block layer 618 is formed.

Figure 7:
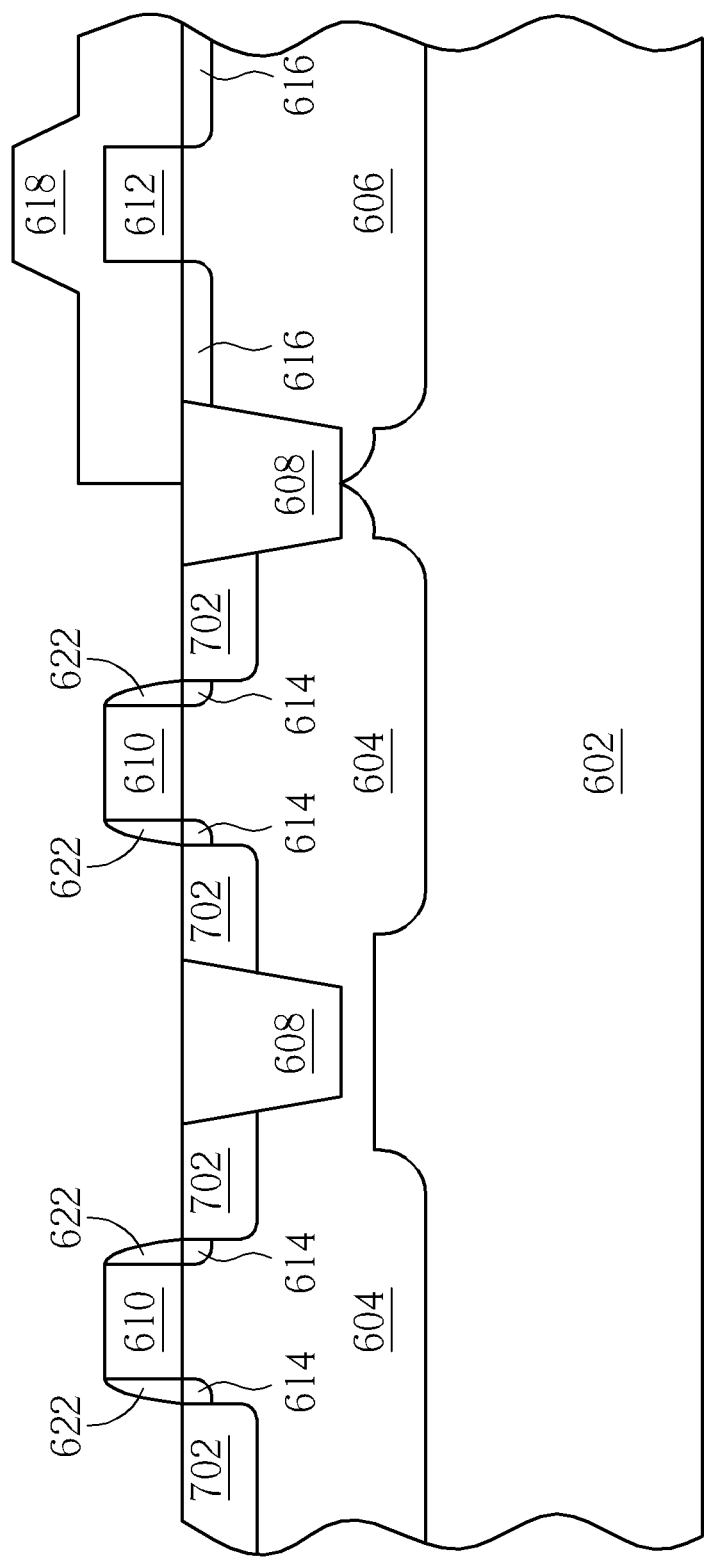

Please refer to FIG. 7. The gate structure 610, the spacer 622, the photo-resist layer 620, and the block layer 618 form a mask. A 7 ion implanting process is performed to form the P⁻ dopant region 702 between the spacer 622 and the STI 608 and in the N well 604. The P⁻ dopant region 702 is not directly under the spacer 622. Next, the patterned photo-resist layer 620 is removed.

Figure 8:
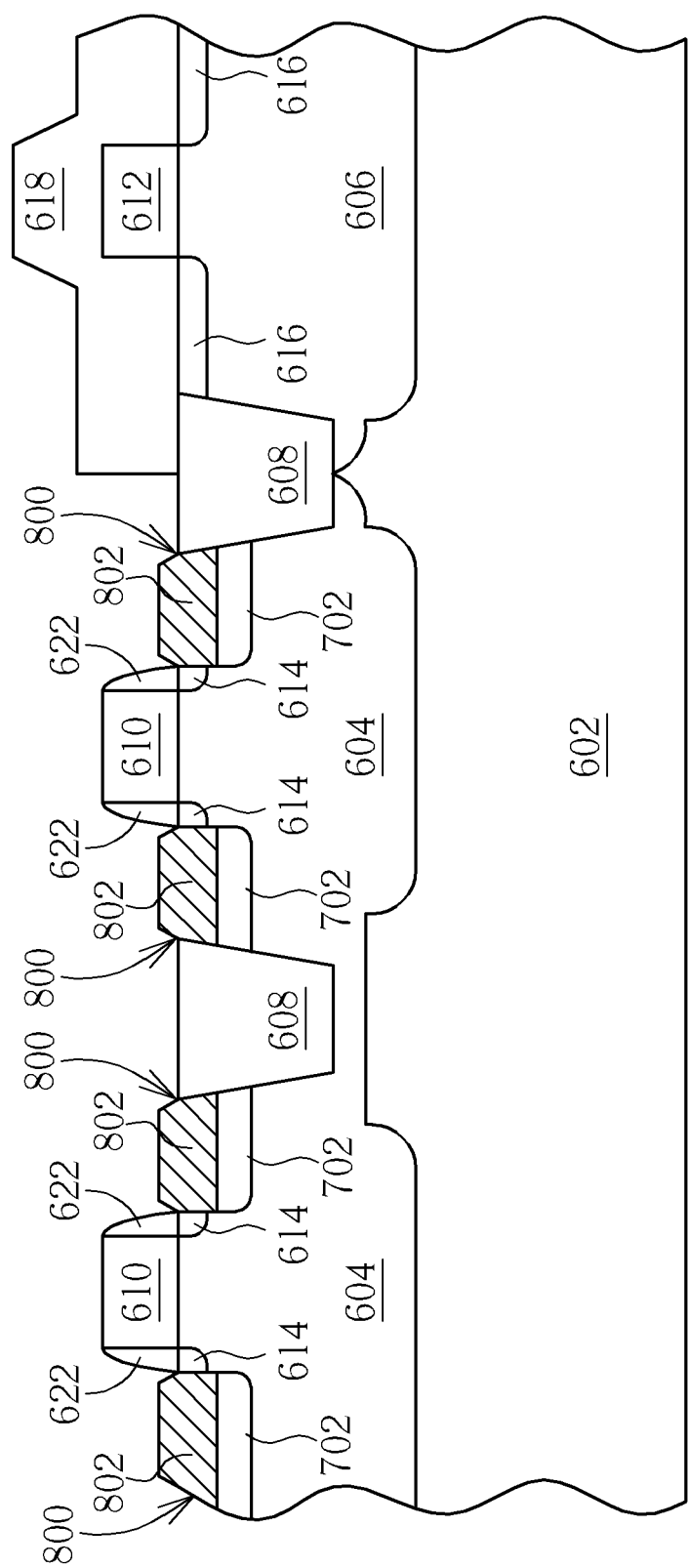

Please refer to FIG. 8. As mentioned above, the gate structure 610, the spacer 622, and the block layer 618 form the mask. An etching process is performed to form a recess 800 between the spacer 622 and the STI 608, and retain the partial P⁻ dopant region 702. Next, a SEG process is performed to form an epitaxial layer 802 in each recess 800. The material of the epitaxial layer 802 is silicon, SiGe, etc.

Figure 9:
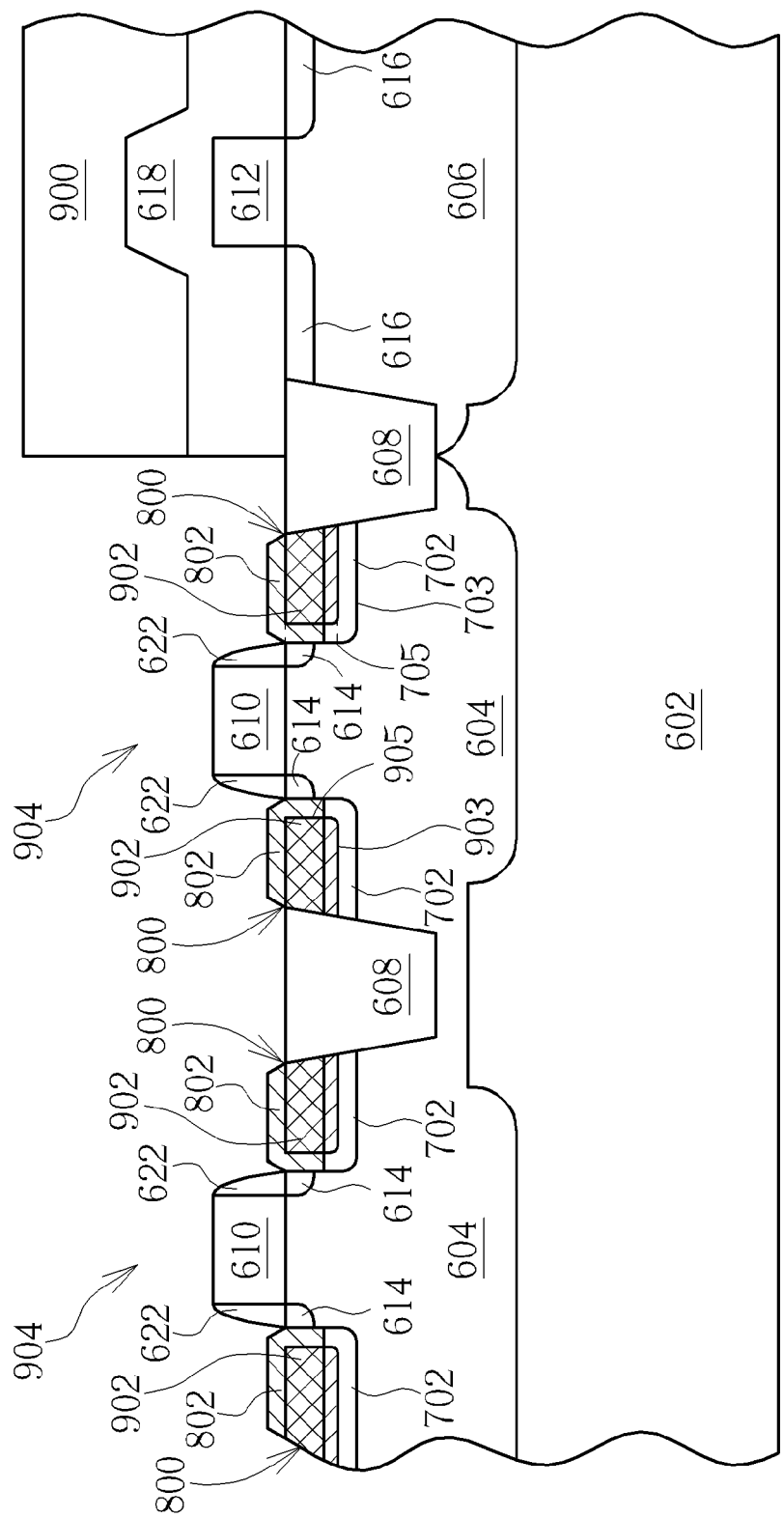

Please refer to FIG. 9. A patterned photo-resist layer 900 is formed on the block layer 618. The gate structure 610 and the spacer 622 form the mask. A P⁺ ion implanting process is performed to form a source/drain 902 between the spacer 622 and the STI 608 and in the epitaxial layer 802. The source/drain 902 is a P⁺ dopant region. The patterned photo-resist layer 900 is then removed. The PMOS transistor 904 of the CMOS transistor in the first embodiment is made by the gate structure 610 and the source/drain 902.

Figure 10:
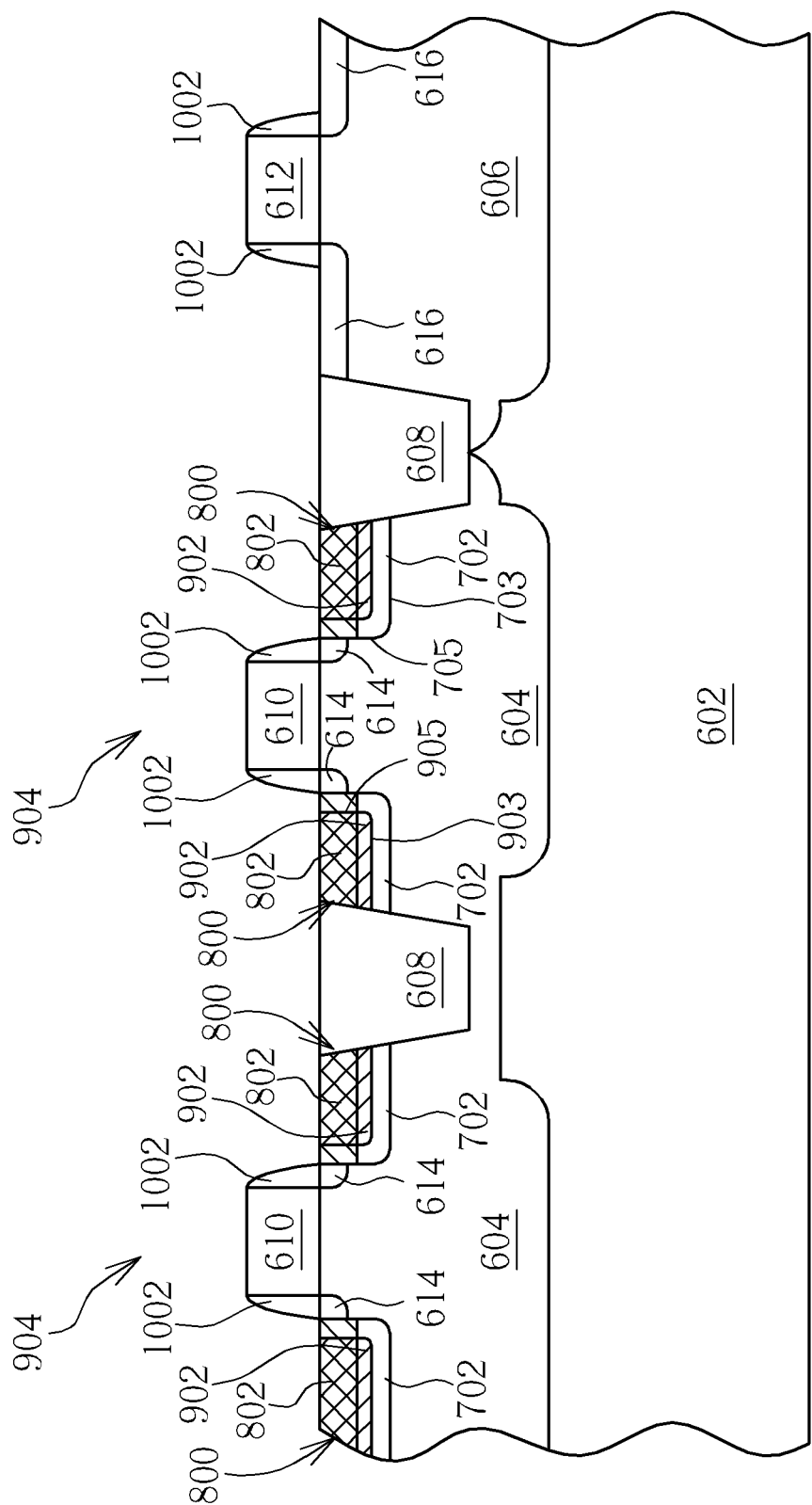

Please refer to FIG. 10. The block layer 618 and the spacer 622 are removed. A dielectric layer (not shown) is deposited on the substrate 602. An anisotropic etching process is performed on the dielectric layer to form a spacer 1002 around the gate structures 610, 612. It is noteworthy that source/drain 902 overlaps with the epitaxial layer 802 and the P⁻ dopant region 702 simultaneously.

Figure 11:
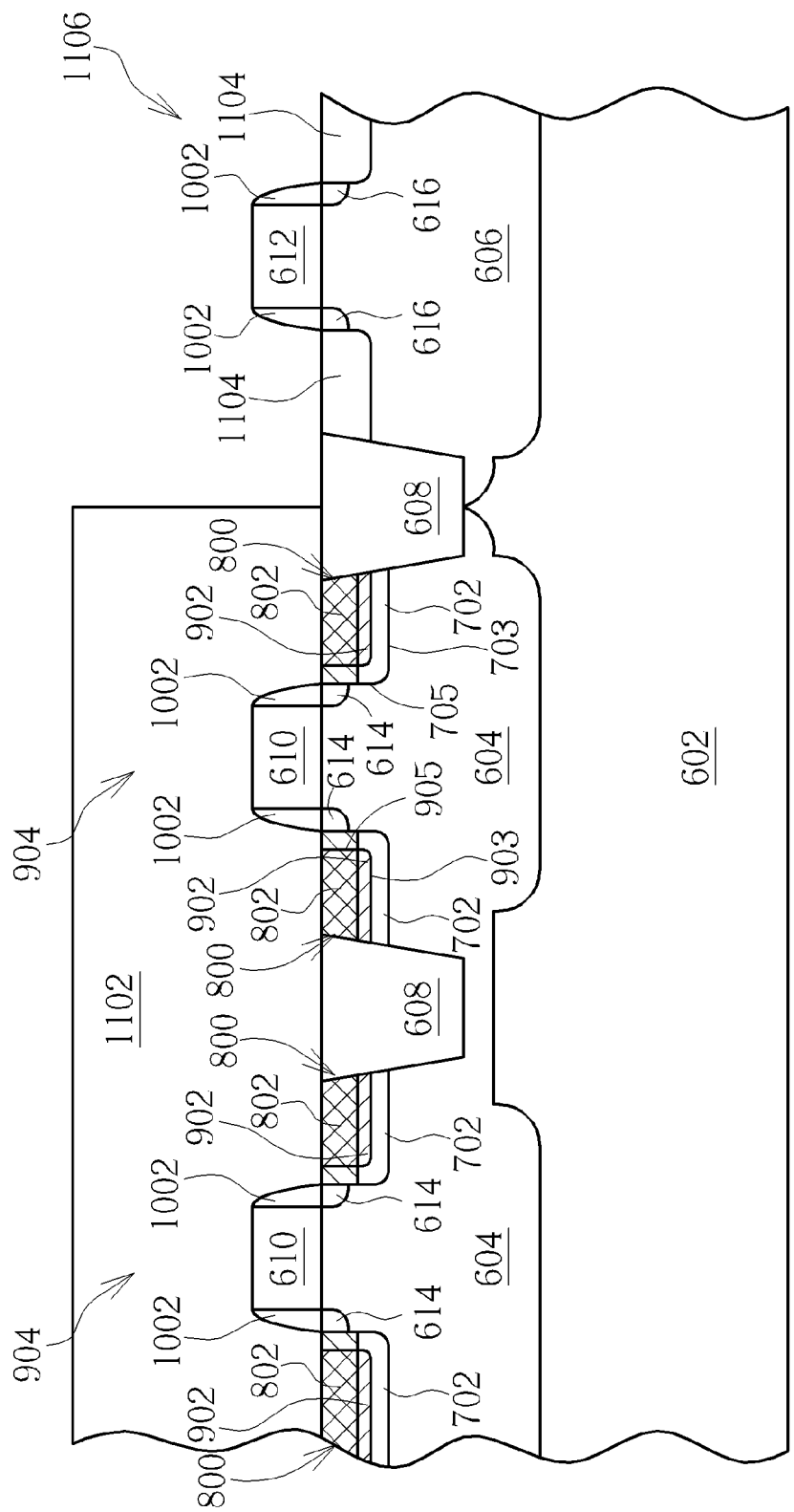

Please refer to FIG. 11. A patterned photo-resist layer 1102 covers the N well 604. Next, an N⁺ ion implanting process is performed to form a source/drain 1104 between the spacer 1002 and the STI 608 and in the P well 606. The source/drain 1104 is an N⁺ dopant region. Afterwards, the patterned photo-resist layer 1102 is removed. The NMOS transistor 1106 of CMOS transistor is made by the gate structure 612 and the source/drain 1104. Subsequently, an annealing process is performed to active the dopant in the substrate 602 to repair the crystal lattice of the damaged substrate 602 surface. Finally, the CMOS transistor of the first embodiment according to the present invention is completed.

In the first embodiment of the present invention, the PMOS transistor 904 of the CMOS transistor has the epitaxial layer, but the NMOS transistor 1106 does not have the epitaxial layer. In other modifications of the present invention, the PMOS transistor 904 and the NMOS transistor 1106 both have an epitaxial layer. The related manufacture is described in the following.

Please refer to FIGS. 12 to 15. FIGS. 12 to 15 are schematic diagrams of partial manufacture according to a second embodiment of the present invention. After the PMOS transistor 904 of the first embodiment is completed, further processes are performed, as illustrated in FIGS. 12 to 15. In other words, the entire method according to the second embodiment is illustrated by FIGS. 6-9 and FIGS. 12-15.

Figure 12:
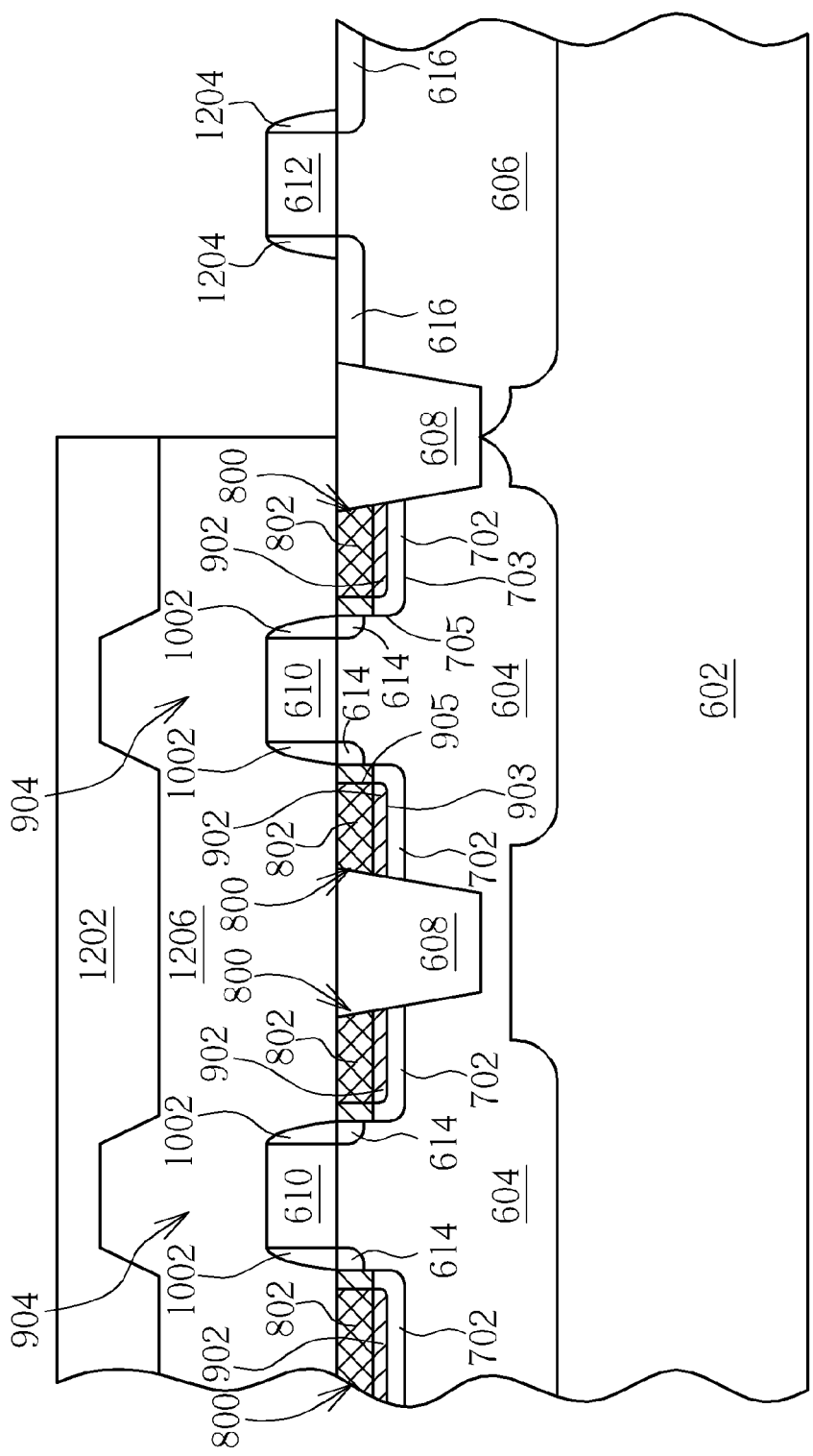
FIGS. 12 to 15 are schematic diagrams of partial manufacture of the CMOS transistor according to the second embodiment of the present invention.

As FIG. 12 shows, when the PMOS transistor 904 is completed, the block layer 618 and the spacer 622 are removed. A dielectric layer (not shown) is deposited on the substrate 602 and covers the gate structures 610, 612. Next, a patterned photo-resist layer 1202 is formed on the dielectric layer, where the patterned photo-resist layer 1202 only covers the N well 604 and does not cover the P well 606. Next, an anisotropic etching process is performed on the dielectric layer to form a spacer 1204 around the gate 612 on the P well 606 and to form a block layer 1206 on the N well 604, because the dielectric layer on the N well 604 is not covered by the patterned photo-resist layer 620.

Figure 13:
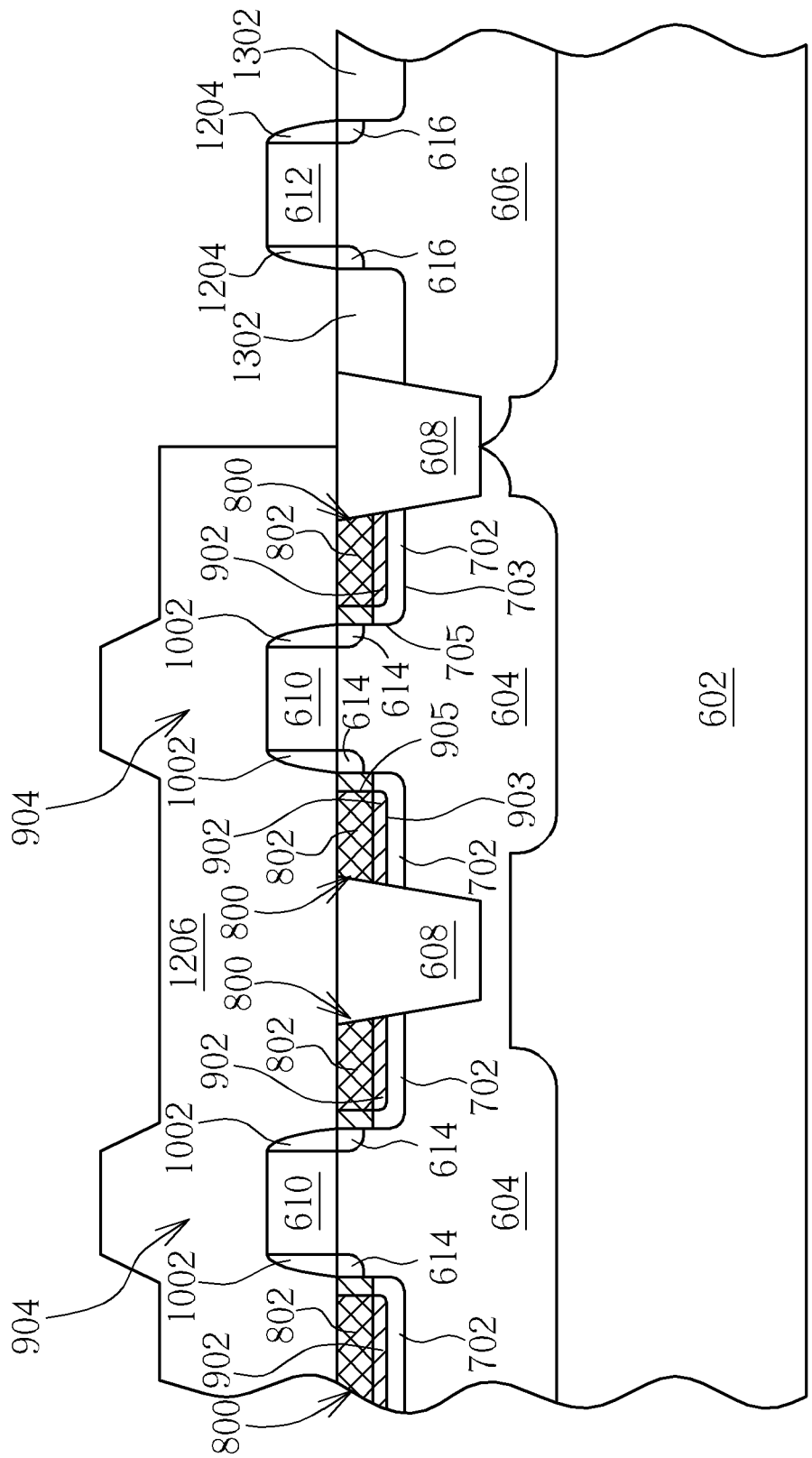
Figure 14:
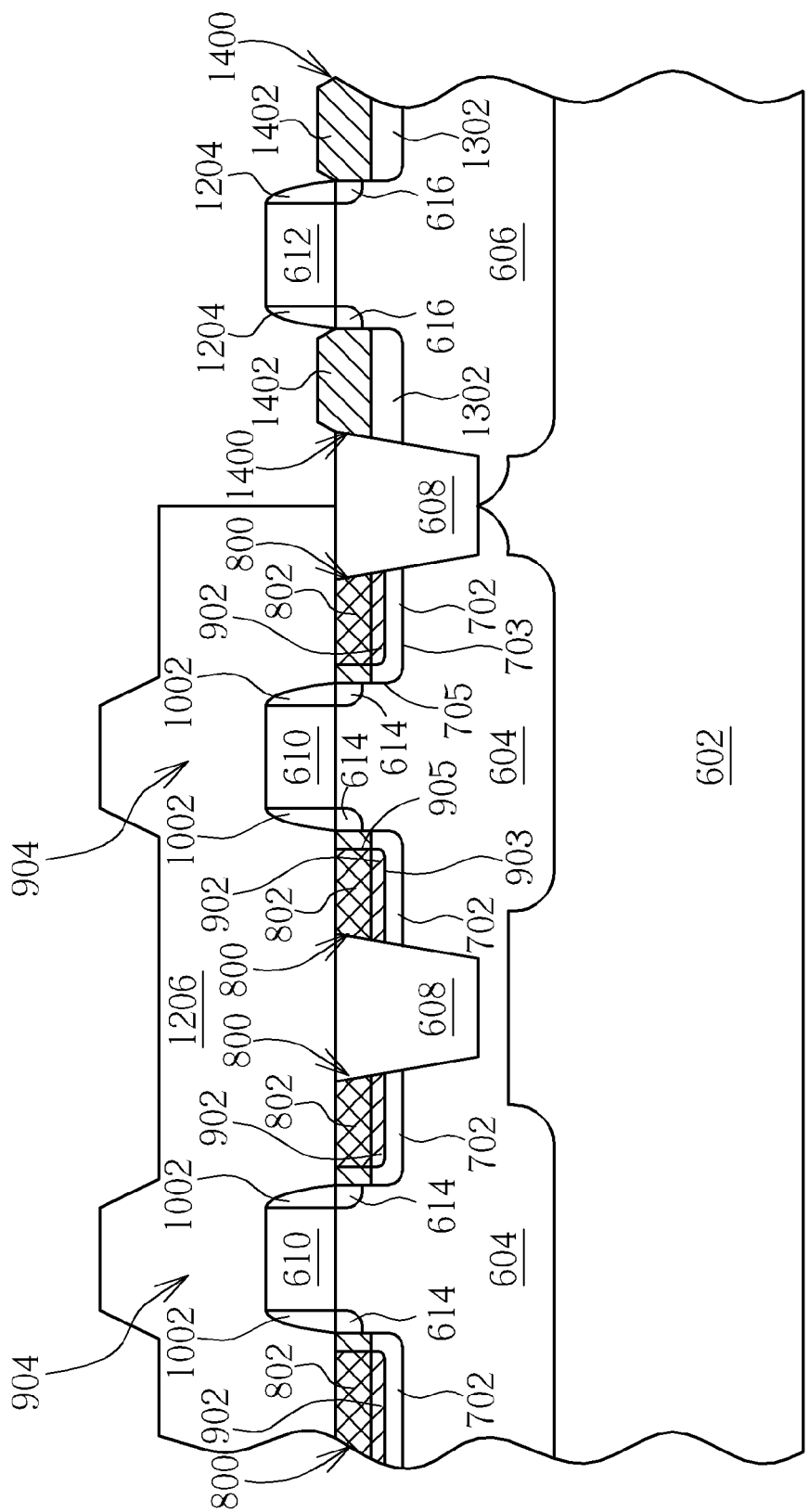

Please refer to FIG. 13. The gate structure 612, the spacer 1204, the patterned photo-resist layer 1202, and the block layer 1206 are the masks. An N$^-$ ion implanting process is performed to form an N$^-$ dopant region 1302 between the spacer 1204 and the STI 608 and in the P well 606. Please refer to FIG. 14, which illustrates the method proceeding from after the patterned photo-resist layer 1202 is removed. The gate structure 612, the spacer 1204, and the block layer 1206 are the masks. An etching process is performed to form a recess 1400 between the spacer 1204 and the STI 608 and in the P well 606, and retain the partial N$^-$ dopant region 1302. Next, a SEG process is performed to form the epitaxial layer 1402 in each recess. The material of the epitaxial layer 1402 is silicon or SiC.

Figure 15:
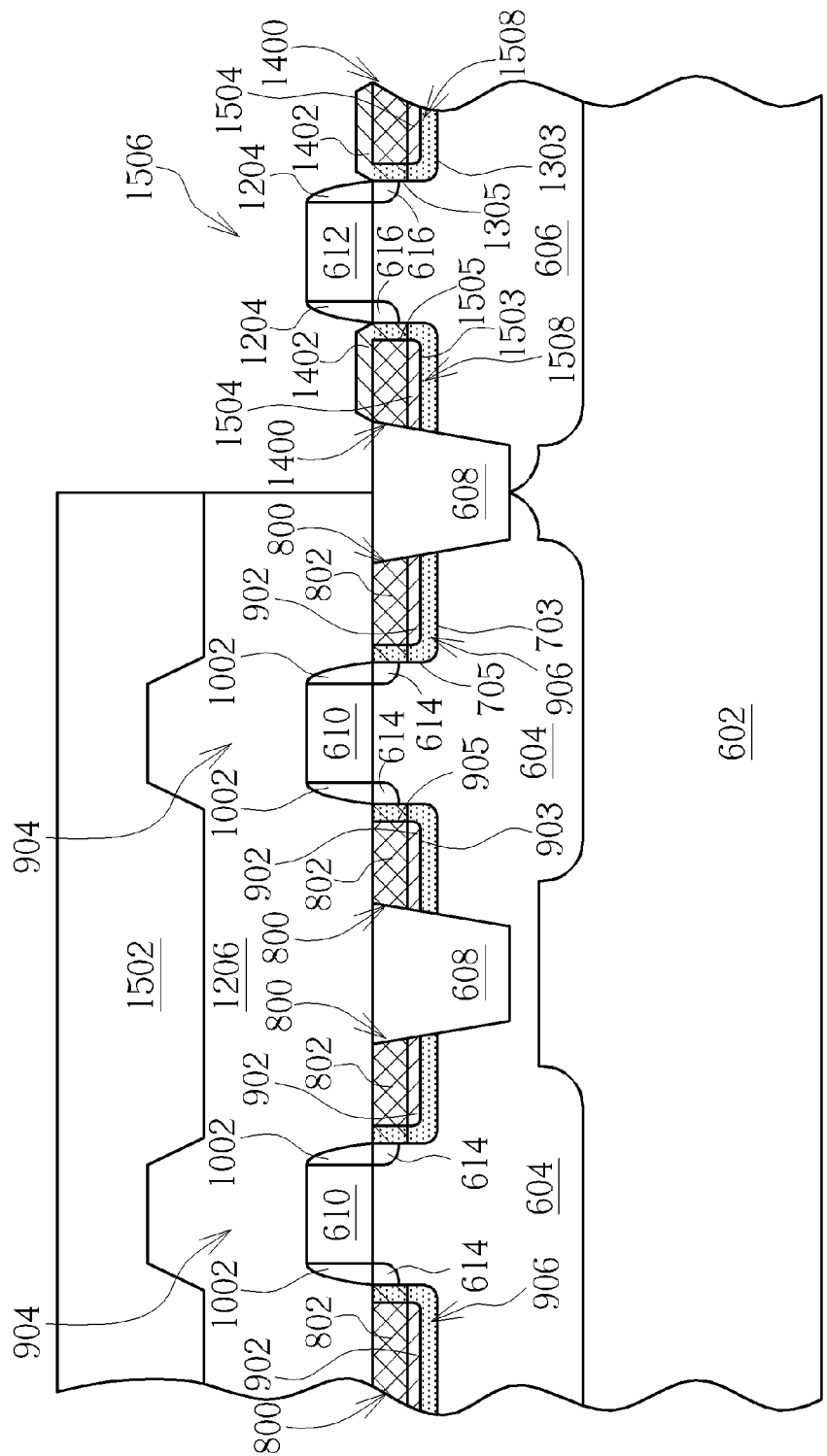

Please refer to FIG. 15. A patterned photo-resist layer 1502 is formed on the block layer 1206. At this point, the gate structure 612, and the spacer 1204 are the mask. An N+ ion implanting process is performed to form the source/drain 1504 of the epitaxial layer 1402 between the spacer 1204 and the STI 608. The source/drain 1504 are N$^+$ dopant regions. Finally, the patterned photo-resist layer 1502 is removed. The NMOS transistor 1506 of the CMOS transistor in this embodiment is made by the gate structure 612 and the source/drain 1504. It is noteworthy that source/drain 1504 overlaps with the epitaxial layer 1402 and N$^-$ dopant region 1302 simultaneously.

Please note that there is a buffer region 906 between the bottom and the lateral side of the remaining P$^-$ dopant region 702 and the bottom and the lateral side of the source/drain 902 for preventing junction leakage in both the first and second embodiments of the present invention. Because the angles of the ion implanting process can be adjusted and the etching process can be controlled, the depth and the width of the P$^-$ dopant region 702 and the depth and the width of the source/drain 902 can be adjusted to make the size of the source/drain 902 is different from that of the P$^-$ dopant region 702 so that only part of the P$^-$ dopant region 702 is overlapped by the source/drain 902. The remaining portion of the P$^-$ dopant region 702 which is not overlapped by the source/drain 902 forms the buffer region 906. Since the buffer region 906 is disposed in the remaining portion of the P$^-$ dopant region 702, the buffer region 906 should have the same composition as the P$^-$ dopant region 702 has. In other words, the P$^-$ dopant region 702 has a first bottom 703, and a first side 705, and the source/drain 902 has a second bottom 903 and a second side 905. The buffer region 906 is disposed between the first bottom 703 of the P$^-$ dopant region 702 and the second bottom 903 of the source/drain 902, and between the first side 705 of the P$^-$ dopant region 702 and the second side 905 of the source/drain 902.

Of course, the same principle can be applied to form the N$^-$ dopant region 1302 and the source/drain 1504. There is a buffer region 1508 between the bottom and the lateral side of the remaining N$^-$ dopant region 1302 and the bottom and the lateral side of the source/drain 1504 to prevent junction leakage. Because the angles of the N$^-$ dopant implanting process and the source/drain implanting process are different, the depth and the width of the N$^-$ dopant region 1302 and the depth and the width of the source/drain 1504 can be adjusted to make the size of the source/drain 1504 is different from that of the N$^-$ dopant region 1302 so that part of the N$^-$ dopant region 1302 is not overlapped by the source/drain 1504. The remaining portion of the N$^-$ dopant region 1302 which is not overlapped by the source/drain 1504 forms the buffer region 1508. Since the buffer region 1508 is disposed in the remaining portion of the N$^-$ dopant region 1302, the buffer region 1508 should have the same composition as the N$^-$ dopant region 1302 has. In other words, the N$^-$ dopant region 1302 has a third bottom 1303, and a third side 1305, and the source/drain 1504 has a fourth bottom 1503 and a fourth side 1505. The buffer region 1508 is disposed between the third bottom 1303 of the N$^-$ dopant region 1302 and fourth bottom 1503 of the source/drain 1504, and between the third side 1305 of the N$^-$ dopant region 1302 and the fourth side 1505 of the source/drain 1504.

The present invention does not need to deposit a cap layer on the substrate, therefore continuous recess etching process will not be influenced as in the prior art. The present invention forms the patterned block layer utilizing the dielectric layer, which forms the spacer. The spacer etching process forms the patterned block layer, and the process of removing the spacer can also remove the block layer. Therefore, the manufacture of the present invention is simpler than the prior art. The poly-line of the gate structure can thereby be smaller. Furthermore, the epitaxial layer has a better effect of providing strain to the substrate, and the performance of the transistor is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal oxide semiconductor transistor, comprising:
   a substrate comprising at least a first well, at least a second well, and an insulation between the first well and the second well;
   a first gate structure disposed on the first well;
   a second gate structure disposed on the second well;
   four first dopant regions disposed in the substrate at two sides of the first gate structure and right below the first gate structure, and in the substrate at two sides of the second gate structure respectively;
   two second dopant regions disposed in the substrate at two sides of the first gate structure respectively;
   two first epitaxial layers disposed in the substrate at two sides of the first gate structure respectively; and
   two first source/drain regions disposed entirely in the second dopant regions at two sides of the first gate structure respectively and not in direct contact with one of the first dopant regions, wherein each of the first source/drain regions only overlaps with one of the first epitaxial layers partly and each of the first source/drain regions overlaps one of the second dopant regions, wherein a first buffer region is disposed between the first bottom of a first remaining portion of each of the second dopant regions and the second bottom of each of the first source/ drain regions and between the first side of the first remaining portion of each of the second dopant regions and the second side of each of the first source/drain regions.

2. The metal oxide semiconductor transistor of claim 1, further comprising a spacer disposed on the first gate structure and the second gate structure.

3. The metal oxide semiconductor transistor of claim 1, further comprising:
two fourth dopant regions in the substrate at the two sides of the second gate structure.

4. The metal oxide semiconductor transistor of claim 1, wherein the first type well is an N well, and the second type well is a P well.

5. The metal oxide semiconductor transistor of claim 2, wherein each of the second dopant regions is not directly under the spacer.

6. The metal oxide semiconductor transistor of claim 3, further comprising:

two second epitaxial layers disposed in the substrate at two sides of the second gate structure respectively; and
two second source/drain regions disposed in the substrate at two sides of the second gate structure respectively, wherein each of the second source/drain regions overlaps with one of the second epitaxial layers and one of the fourth dopant regions simultaneously.

7. The metal oxide semiconductor transistor of claim 6, wherein each of the fourth dopant regions has a third bottom and a third side, and each of the second source/drain regions has a fourth bottom and a fourth side.

8. The metal oxide semiconductor transistor of claim 7, wherein a second buffer region is disposed between the third bottom of a second remaining portion of each of the fourth dopant regions and the fourth bottom of each of the second source/drain regions, and between the third side the second remaining portion of each of the fourth dopant regions and the fourth side of each of the second source/drain regions.

* * * * *